(12) United States Patent
Okumura et al.

(10) Patent No.: US 9,343,269 B2
(45) Date of Patent: May 17, 2016

(54) PLASMA PROCESSING APPARATUS

(71) Applicant: Panasonic Corporation, Osaka (JP)

(72) Inventors: Tomohiro Okumura, Osaka (JP);
Hiroshi Kawaura, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 600 days.

(21) Appl. No.: 13/661,115

(22) Filed: Oct. 26, 2012

(65) Prior Publication Data

US 2013/0105460 A1 May 2, 2013

(30) Foreign Application Priority Data

Oct. 27, 2011 (JP) ................... 2011-235764

(51) Int. Cl.
*H05H 1/46* (2006.01)
*H01J 37/32* (2006.01)
*H05H 1/30* (2006.01)

(52) U.S. Cl.
CPC ........... *H01J 37/321* (2013.01); *H01J 37/3211* (2013.01); *H01J 37/3244* (2013.01); *H01J 37/32357* (2013.01); *H01J 37/32376* (2013.01); *H01J 37/32807* (2013.01); *H05H 1/30* (2013.01); *H05H 2001/4667* (2013.01)

(58) Field of Classification Search
None
See application file for complete search history.

(56) References Cited

U.S. PATENT DOCUMENTS

| | | | |
|---|---|---|---|
| 4,948,458 A | 8/1990 | Ogle | |
| 5,290,382 A * | 3/1994 | Zarowin et al. | 156/345.35 |
| 5,877,471 A * | 3/1999 | Huhn et al. | 219/121.49 |
| 5,993,594 A | 11/1999 | Wicker et al. | |
| 6,071,372 A | 6/2000 | Ye et al. | |
| 6,262,386 B1 | 7/2001 | Fornsel | |
| 6,265,690 B1 | 7/2001 | Fornsel et al. | |
| 6,489,585 B1 * | 12/2002 | Nakamura et al. | 219/121.52 |
| 8,142,607 B2 * | 3/2012 | Biloiu et al. | 156/345.39 |
| 8,659,229 B2 * | 2/2014 | Kurunczi et al. | 315/111.21 |

(Continued)

FOREIGN PATENT DOCUMENTS

| | | |
|---|---|---|
| CN | 1283076 | 2/2001 |
| CN | 100393182 C | 6/2008 |

(Continued)

OTHER PUBLICATIONS

"Crystallization of Si in Millisecond Time Domain Induced by Thermal Plasma Jet Irradiation," Seiichiro Higashi et al., Japanese Journal of Applied Physics, vol. 45, No. 5B, pp. 4313-4320 (2006).

(Continued)

*Primary Examiner* — Joseph M Pelham
(74) *Attorney, Agent, or Firm* — PIPM

(57) ABSTRACT

A plasma processing apparatus has a long chamber having an opening portion, a gas supply apparatus that supplies gas into the chamber, a spiral coil having a long shape in parallel with the longitudinal direction of the chamber, a high-frequency electric power supply connected to the spiral coil, a base material mounting table which is disposed opposite to the opening portion and holds a base material and a moving mechanism which is disposed in parallel with the longitudinal direction of the chamber and the longitudinal direction of the opening portion, and enables the chamber and the base material mounting table to relatively move perpendicularly with respect to the longitudinal direction of the opening portion.

6 Claims, 13 Drawing Sheets

(56) References Cited

U.S. PATENT DOCUMENTS

| | | | |
|---|---|---|---|
| 8,664,861 B1* | 3/2014 | Fujita et al. | 315/111.21 |
| 8,692,468 B2* | 4/2014 | Hadidi et al. | 315/111.81 |
| 8,809,803 B2* | 8/2014 | Biloiu et al. | 250/423 R |
| 2003/0057845 A1 | 3/2003 | Edamura et al. | |
| 2003/0080097 A1* | 5/2003 | Boulos et al. | 219/121.49 |
| 2005/0017646 A1 | 1/2005 | Boulos et al. | |
| 2006/0011231 A1 | 1/2006 | Ueda et al. | |
| 2007/0137576 A1* | 6/2007 | Kurunczi et al. | 118/723 R |
| 2008/0023070 A1 | 1/2008 | Sinha | |
| 2009/0166555 A1* | 7/2009 | Olson et al. | 250/427 |
| 2010/0296979 A1 | 11/2010 | Hori et al. | |
| 2011/0045205 A1 | 2/2011 | Rostaing et al. | |
| 2011/0297089 A1 | 12/2011 | Ueda et al. | |
| 2012/0058649 A1* | 3/2012 | Okumura et al. | 438/798 |
| 2012/0115317 A1* | 5/2012 | Okumura et al. | 438/513 |
| 2012/0325777 A1* | 12/2012 | Okumura et al. | 216/68 |
| 2013/0115780 A1* | 5/2013 | Okumura et al. | 438/710 |
| 2013/0230990 A1* | 9/2013 | Okumura | H01L 21/268 438/778 |
| 2013/0299091 A1* | 11/2013 | Sakka et al. | 156/345.48 |
| 2014/0021861 A1* | 1/2014 | Carducci | H05H 1/46 315/111.51 |
| 2014/0291290 A1* | 10/2014 | Kitaoka et al. | 216/68 |
| 2015/0053645 A1* | 2/2015 | Okumura | 216/68 |
| 2015/0118867 A1* | 4/2015 | Okumura | 438/798 |
| 2015/0221475 A1* | 8/2015 | Okumura | 438/710 |
| 2015/0294866 A1* | 10/2015 | Okumura et al. | 438/798 |

FOREIGN PATENT DOCUMENTS

| | | |
|---|---|---|
| CN | 101341570 | 1/2009 |
| CN | 101617409 | 12/2009 |
| JP | 03-079025 | 4/1991 |
| JP | 04-284974 | 10/1992 |
| JP | 08-118027 | 5/1996 |
| JP | 2001-068298 | 3/2001 |
| JP | 2002-500818 | 1/2002 |
| JP | 2003-086577 | 3/2003 |
| JP | 2005-079533 | 3/2005 |
| JP | 2007-287452 | 11/2007 |
| JP | 2007-287454 | 11/2007 |
| JP | 2008-053634 | 3/2008 |
| JP | 2008-106362 | 5/2008 |
| JP | 2009-520324 | 5/2009 |
| JP | 2009-158251 | 7/2009 |
| JP | 2009-545165 | 12/2009 |
| JP | 2010-539336 | 12/2010 |

OTHER PUBLICATIONS

English translation of Search Report which is an annex to Office Action dated Dec. 22, 2014 for the corresponding Chinese Patent Application No. 201210414355.6 and all relevant patent documents listed above.

English Translation of Chinese Search Report dated Jul. 21, 2015 for the related Chinese Patent Application No. 201210414355.6.

* cited by examiner

PLASMA PROCESSING APPARATUS

TECHNICAL FIELD

The present invention relates to a plasma processing apparatus and a plasma processing method. The invention relates to a plasma processing apparatus and a plasma processing method of a thermal plasma processing in which thermal plasma is irradiated to a base material so as to treat the base material, a low-temperature plasma processing in which plasma from reaction gas or plasma and a reaction gas flow are irradiated at the same time to a base material so as to treat the base material, and the like.

BACKGROUND ART

In the past, a semiconductor thin film such as polycrystalline silicon (hereinafter also referred to as "poly-Si") was widely used for thin film transistors (hereinafter also referred to as "TFT") or solar cells. Particularly, poly-Si TFT is widely used for, for example, a switching element that composes a pixel circuit such as a liquid crystal display apparatus, a liquid crystal projector, or an organic EL display apparatus or a circuit element of a liquid crystal driver using its characteristic that poly-Si TFT can be manufactured on a transparent insulating substrate such as a glass substrate due to a high carrier mobility.

As a method of manufacturing a high-performance TFT on a glass substrate, a manufacturing method termed a "high-temperature process" is generally used. Among TFT-manufacturing processes, a process in which the peak temperature reaches a high temperature of approximately 1000° C. is termed the "high-temperature process". The characteristics of the high-temperature process include a capability of forming a relatively favorable polycrystalline silicon film using the solid-phase growth of silicon, a capability of obtaining a favorable gate insulating layer using thermal oxidation of silicon, and a capability of forming an interface between pure polycrystalline silicon and the gate insulating layer. In the high-temperature process, a high-performance TFT having a high mobility and high reliability can be stably manufactured due to the above characteristics.

On the other hand, in order to crystallize a silicon film using solid-phase growth in the high-temperature process, it is necessary to perform a thermal treatment at a temperature of approximately 600° C. for a long period of time of approximately 48 hours. The above necessity makes the process be a significantly long process, and, in order to increase the throughput of the process, essentially, there are problems in that a number of thermal treatment furnaces are required, and it is difficult to reduce the cost. Additionally, since quartz glass should be used as the highly heat-resistant insulating substrate, the cost for a substrate is high, which does not make an increase in the size suitable.

Meanwhile, a technique for manufacturing a poly-Si TFT on a cheap and large-area glass substrate by lowering the peak temperature in the process is termed a "low-temperature process". Among TFT-manufacturing processes, a process in which a poly-Si TFT is manufactured on a relatively cheap heat-resistant glass substrate under a temperature environment in which the peak temperature is approximately 600° C. or lower is generally termed the "low-temperature process". In the low-temperature process, a laser crystallization technique in which a silicon film is crystallized using a pulse laser having an extremely short oscillation time is widely used. Laser crystallization refers to a technique using a property of a silicon thin film being crystallized in a process in which the silicon thin film on a substrate is irradiated with a high-output pulse laser ray so as to be instantly melted and solidified.

However, the laser crystallization technique has several large problems. The first problem is a large number of trapping levels that are locally present in a polysilicon film formed using a laser crystallization technique. Due to the presence of the trapping levels, carriers which are originally supposed to move through an active layer are trapped by application of a voltage, and thus cannot contribute to electrical conduction, which results in the adverse influences of a decrease in the mobility of the TFT and an increase in the threshold voltage.

Furthermore, due to limitations of the laser output, there is another problem in that the size of the glass substrate is limited. In order to improve the throughput of the laser crystallization process, it is necessary to increase the area that can be crystallized in a single round. However, since there is a limitation on the current laser output, in a case in which the crystallization technique is employed in a large-scale substrate called the $7^{th}$ generation (1800 mm×2100 mm), a long period of time is required to crystallize a single substrate.

In addition, in the laser crystallization technique, generally, a linearly-formed laser is used, and crystallization is performed by scanning with the linearly-formed laser. This line beam is shorter than the width of the substrate due to a limitation in laser output, and, in order to crystallize the entire surface of the substrate, it is necessary to scan the laser over several times. As a result, joint areas of the line beam are generated in the substrate, and areas scanned twice are generated. These areas have significantly different crystallinity from the areas crystallized with a single round of scanning. Therefore, element characteristics are significantly different at both areas, which causes a large variation in devices.

Finally, since a laser crystallization apparatus has a complex apparatus configuration and a large cost for consumable components, there are problems of large apparatus costs and running costs. As a result, the manufacturing costs for a TFT for which a polysilicon film crystallized using the laser crystallization apparatus is used also increases.

In order to overcome the problems of the limitation on the size of the substrate and the large apparatus costs, a crystallization technique termed a "thermal plasma jet crystallization method" is being studied (for example, refer to Non Patent Document 1). Hereinafter, this technique will be described simply. A tungsten (W) anode and a water-cooled copper (Cu) cathode are disposed opposite to each other, and an arc discharge is generated between both electrodes when a DC voltage is applied. When argon gas is made to flow between the electrodes under atmospheric pressure, thermal plasma is ejected from an ejection hole opened in the copper cathode.

The thermal plasma refers to thermal equilibrium plasma, and is an ultra high-temperature heat source in which ions, electrons, neutral atoms, and the like have substantially the same temperature which is approximately 10000 K. Due to the above fact, the thermal plasma can easily heat matter to a high temperature, and an amorphous silicon (hereinafter also referred to as "a-Si") film can be crystallized by scanning a substrate having the amorphous silicon film deposited thereon against the front surface of ultra high-temperature thermal plasma at a high rate.

As such, since the apparatus configuration is extremely simple, and crystallization is achieved under the atmosphere in the process, it is not necessary to cover the apparatus with an expensive member such as a sealed chamber, and a significant decrease in the apparatus costs can be expected. In addition, since utilities necessary for crystallization are argon gas, electric power, and cooling water, the crystallization technique also has a low running cost.

FIG. 20 is a schematic diagram for explaining the crystallization method of a semiconductor film in which thermal plasma is used. In FIG. 20, a thermal plasma-generating apparatus 31 is configured to have an anode 32 and a cathode 33 which is disposed opposite to the anode 32 with a predetermined distance therebetween. The anode 32 is composed of, for example, a conductor such as tungsten. The cathode 33 is composed of, for example, a conductor such as copper. In addition, the cathode 33 is formed to be hollow, and is configured to allow water to pass through the hollow portion so as to make cooling possible. In addition, an ejection hole (nozzle) 34 is provided in the cathode 33. When a direct (DC) voltage is applied between the anode 32 and the cathode 33, an arc discharge is generated between both electrodes. When gas such as argon gas is made to flow between the anode 32 and the cathode 33 under the atmosphere in the above state, it is possible to eject thermal plasma 35 from the ejection hole 34. Here, the "thermal plasma" refers to thermal equilibrium plasma, and is an ultra high-temperature heat source in which ions, electrons, neutral atoms, and the like have substantially the same temperature which is approximately 10000 K.

The thermal plasma can be used for a thermal treatment for crystallization of a semiconductor film. Specifically, a semiconductor film 37 (for example, an amorphous silicon film) is formed on a substrate 36, and the thermal plasma (thermal plasma jet) 35 is made to hit the semiconductor film 37. At this time, the thermal plasma 35 is made to hit the semiconductor film 37 while relatively moving along the first axis (the horizontal direction in the example shown in the drawing) that is parallel to the surface of the semiconductor film 37. That is, the thermal plasma 35 is made to hit the semiconductor film 37 while scanning in the first axial direction.

Here, the "relatively moving" means that the semiconductor film 37 (and the substrate 36 that supports the semiconductor film) and the thermal plasma 35 are made to move relatively, which includes a case in which only one of both is made to move and a case in which both are made to move. Using the scanning of the thermal plasma 35, the semiconductor film 37 is heated due to a high temperature of the thermal plasma 35, and the crystallized semiconductor film (a polysilicon film in the present example) is obtained (for example, refer to Patent Document 1).

FIG. 21 is a conceptual view showing the relationship between the depth from the outermost surface and the temperature. As shown in the diagram, it is possible to treat only the vicinities of the surface at a high temperature by moving the thermal plasma 35 at a high rate. Since the heated areas rapidly cool after the thermal plasma 35 passes through, the vicinities of the surface remain at a high temperature for an extremely short period of time.

The thermal plasma is generally generated in dotted areas. The thermal plasma is maintained using thermionic emission from the anode 32. The thermionic emission becomes more active at locations having a high plasma density, and therefore a positive feedback is applied, and the plasma density gradually increases. That is, the arc discharge is generated intensely at one point in the anode, and the thermal plasma is generated in dotted areas.

In a case in which it is necessary to uniformly treat a tabular base material for crystallization of a semiconductor film, and the like, it is necessary to scan dotted thermal plasma across the entire base material. However, in order to build a process in which the number of times of scanning is reduced so that a treatment can be performed within a shorter period of time, it is effective to widen the irradiation area of the thermal plasma. Therefore, techniques that generate thermal plasma in a large area have thus far been being studied.

For example, a method is disclosed in which broadening gas for broadening a plasma jet is sprayed to the plasma jet sprayed from an external nozzle of a plasma torch from two places at the same time in a direction that intersects with the central axis line of the external nozzle so as to widen the plasma jet (for example, refer to Patent Document 2). Alternatively, a method is disclosed in which a plasma nozzle in which the opening portion of the nozzle path is inclined at a predetermined angle with respect to the core of the nozzle path is provided, and a casing or part of the casing that composes the nozzle path is rotated around the longitudinal core at a high rate, thereby passing the plasma nozzle through a workpiece (for example, refer to Patent Document 3). In addition, an apparatus provided with a rotary head having at least one eccentrically disposed plasma nozzle is disclosed (for example, refer to Patent Document 4).

Meanwhile, although not aiming to treat a large area within a short period of time, a high-speed gas shield arc welding method in which band-shaped electrodes are used, and disposed so that the width direction forms the welding line direction, and welding is performed is disclosed as a welding method using the thermal plasma (for example, refer to Patent Document 5).

In addition, an induction coupling-type plasma torch forming a linear thin and long shape for which a flat rectangular insulating material is used is disclosed (for example, refer to Patent Document 6).

Meanwhile, a method of generating thin and long linear plasma in which long electrodes are used is disclosed (for example, refer to Patent Document 7). Although described to generate thermal plasma, the method is to generate low-temperature plasma, and is not a configuration appropriate for a thermal treatment. If thermal plasma is generated, since the method is a capacity coupling-type in which electrodes are used, it is assumed that an arc discharge is focused at one place, and it is difficult to generate uniform thermal plasma in the longitudinal direction. Meanwhile, as a low-temperature plasma processing apparatus, an apparatus with which a plasma processing such as etching or film formation is possible by plasmatizing etching gas or chemical vapor deposition (CVD) gas is used.

In addition, a method in which long plasma is generated using a micro strip line is disclosed (for example, refer to Patent Document 8). In this configuration, since the chamber wall surface into which plasma comes into contact cannot be completely cooled (not surrounded by a water cooling path), it is considered that the configuration cannot work as a thermal plasma source.

In addition, an apparatus in which a plurality of discharge electrodes are arrayed linearly so as to form a linear long plasma torch (for example, refer to Patent Document 9).

Meanwhile, an apparatus for etching or CVD for which a planar spiral coil is used is disclosed (for example, refer to Patent Document 10), but the apparatus is to collectively treat the surface of a base material into a surface shape by generating large-area plasma in a vacuum, and relates to a technical field different from the technical field of the invention.

Additionally, induction coupling-type plasma apparatuses which have an outlet path of thin and long plasma and are long in a perpendicular direction to the direction of gravity (for example, refer to Patent Document 11) or induction coupling-type plasma apparatuses having a characteristic in the shape of a coil (for example, refer to Patent Document 12 and 13) are disclosed.

CITATION LIST

Patent Literature

PTL 1
Japanese Patent Application Laid-Open No. 2008-53634
PTL 2
Japanese Patent Application Laid-Open No. H08-118027
PTL 3
Japanese Patent Application Laid-Open No. 2001-68298
PTL 4
Japanese Translation of a PCT Application Laid-Open No. 2002-500818
PTL 5
Japanese Patent Application Laid-Open No. H04-284974
PTL 6
Japanese Translation of a PCT Application Laid-Open No. 2009-545165
PTL 7
Japanese Patent Application Laid-Open No. 2007-287454
PTL 8
Japanese Translation of a PCT Application Laid-Open No. 2010-539336
PTL 9
Japanese Patent Application Laid-Open No. 2009-158251
PTL 10
Japanese Patent Application Laid-Open No. H03-79025
PTL 11
Japanese Translation of a PCT Application Laid-Open No. 2009-520324
PTL 12
Japanese Patent Application Laid-Open No. 2008-106362
PTL 13
Japanese Patent Application Laid-Open No. 2003-86577

Non Patent Literature

NPL 1
S. Higashi, H. Kaku, T. Okada, H. Murakami and S. Miyazaki, "Crystallization of Si in Millisecond Time Domain Induced by Thermal Plasma Jet Irradiation" Jpn. J. Appl. Phys. 45 (2006) pp. 4313 to 4320

SUMMARY OF THE INVENTION

Technical Problem

However, the techniques of the related art for generating thermal plasma in a large area were not effective for use in a case where the vicinities of the surface of a base material are treated at a high temperature only for an extremely short period of time such as crystallization of a semiconductor.

In the technique for generating thermal plasma in a large area which is described in Patent Document 2 in the examples of the related art, broadening is achieved, but the temperature distribution becomes 100° C. or higher in the widened areas, and a uniform thermal treatment cannot be realized.

In addition, the techniques for generating thermal plasma in a large area which are described in Patent Documents 3 and 4 in the examples of the related art are essentially to oscillate thermal plasma. Therefore, since the substantial thermal treatment time becomes short compared to a case in which thermal plasma is scanned without rotating the casing or the rotary head, the time for treating a large area does not become particularly short. In addition, for a uniform treatment, it is necessary to sufficiently increase the rotation rate compared to the scanning rate, and there is no way of avoiding the configuration of the nozzle becoming complex.

In addition, the technique described in Patent Document 5 in the examples of the related art is a welding technique, which is not a configuration for a uniform treatment of a large area. Even when the technique is applied to use of a large area treatment, in this configuration, since the dotted arcs vibrate along the band-shaped electrodes, uniform plasma is generated in a time-average manner; however, non-uniform plasma is generated instantly. Therefore, the technique cannot be applied to a uniform treatment of a large area.

In addition, unlike the technique described in Non Patent Document 1 or Patent Document 1 in which a DC arc discharge is used, the technique described in Patent Document 6 in the examples of the related art has a characteristic of using an induction coupling-type high-frequency plasma torch. Since the technique is an electrodeless discharge, the technique has advantages of excellent stability of thermal plasma (small variation over time) and little incorporation of electrode materials into the base materials (contamination).

In the induction coupling-type plasma torch, a method in which an insulating material configures double tubes, and a cooling medium is made to flow between the double tubes in order to protect the insulating material from high-temperature plasma is generally employed. However, in the technique described in Patent Document 6 in the examples of the related art, since the insulating material forms a flat rectangular shape, it is not possible for a sufficient flux of a cooling medium to flow simply by configuring double tubes using the insulating material. This is because the insulating material generally has a poor mechanical strength compared to metal, and, when the insulating material is made to be long in the longitudinal direction, it becomes impossible to increase the internal pressure of the double tubes. Therefore, there is a limitation on a uniform treatment of a large area.

The technique described in Patent Document 6 in the examples of the related art has a configuration in which only an extremely small part of the high-temperature plasma formed in a space inside the insulating material which is ejected from the bottom portion directly acts on the base material. Therefore, even when it is assumed that there are no problems with cooling of the insulating material, there is still a problem of poor power efficiency. In addition, since the plasma density increases near the center in the space inside the insulating material, there are problems in that the plasma becomes non-uniform in the longitudinal direction, and the base material cannot be uniformly treated.

Meanwhile, even for dotted thermal plasma, when the diameter is large, the number of times of scanning decreases during a large area treatment, and therefore a treatment can be carried out within a short period of time depending on use. However, when the diameter of the thermal plasma is large, since the time in which the thermal plasma passes above the base material during scanning substantially increases, it is not possible to treat only the vicinity of the surface of the base material at a high temperature only for an extremely short period of time, the base material reaches a high temperature even in a very deep area, and there are cases in which a disadvantage, for example, cracking or peeling of the glass substrate occurs.

In addition, the technique described in Patent Document 9 in the examples of the related art has disadvantages of poor stability of thermal plasma (large variation over time) and much incorporation of the electrode materials into the base material (contamination) compared to the induction coupling-type high-frequency plasma torch described above.

The invention has been made in consideration of the above problems, and relates to a low-temperature plasma processing of a base material when the vicinities of the surface of the base material are uniformly treated thermally only for a short period of time, or plasma from reaction gas or plasma and a reaction gas flow are irradiated at the same time to the base material.

An object of the invention is to provide a plasma processing apparatus and a plasma processing method with which all of the desired areas to be treated of a base material can be treated within a short period of time.

Solution to Problem

A first aspect of the invention is a plasma processing apparatus having a long chamber having an opening portion, a gas supply apparatus that supplies gas into the chamber, a spiral coil having a long shape in parallel with the longitudinal direction of the chamber, a high-frequency electric power supply connected to the spiral coil, a base material mounting table which is disposed opposite to the opening portion and holds a base material and a moving mechanism which is disposed in parallel with the longitudinal direction of the chamber and the longitudinal direction of the opening portion, and enables the chamber and the base material mounting table to relatively move perpendicularly with respect to the longitudinal direction of the opening portion.

In this case, when the "depth of the chamber" is defined to be the "length of the chamber in the depth direction with respect to the short direction and the longitudinal direction of the chamber in the inside of the chamber", and the depth of the chamber is preferably 0.5 mm to 7 mm.

A second aspect of the invention is a plasma processing method having (a) preparing a base material, (b) preparing a long chamber which is formed of a dielectric member having a plasma ejection port provided in parallel with the longitudinal direction at the bottom end and a plasma generating area therein, (c) introducing gas into the chamber, and generating a high-frequency electromagnetic field in the chamber, thereby generating plasma in the chamber, (d) disposing the chamber above the base material, and plasma-treating the surface of the base material by using the plasma, and (e) moving relatively the base material and the chamber perpendicularly with respect to the longitudinal direction of the plasma ejection port, in which, when the "depth of the chamber" is defined to be the "length of the chamber in the depth direction with respect to the short direction and the longitudinal direction of the chamber in the inside of the chamber", the depth of the chamber is 0.5 mm to 7 mm.

Advantageous Effects of Invention

According to the invention, it is possible to treat all of the desired areas to be treated of a base material within a short period of time.

DESCRIPTION OF EMBODIMENTS

Hereinafter, plasma processing apparatuses according to embodiments will be described using the accompanying drawings.

(Embodiment 1)

Hereinafter, a first embodiment will be described with reference to FIGS. 1A, 1B, 2, 3A and 3B.

Figure 1A:
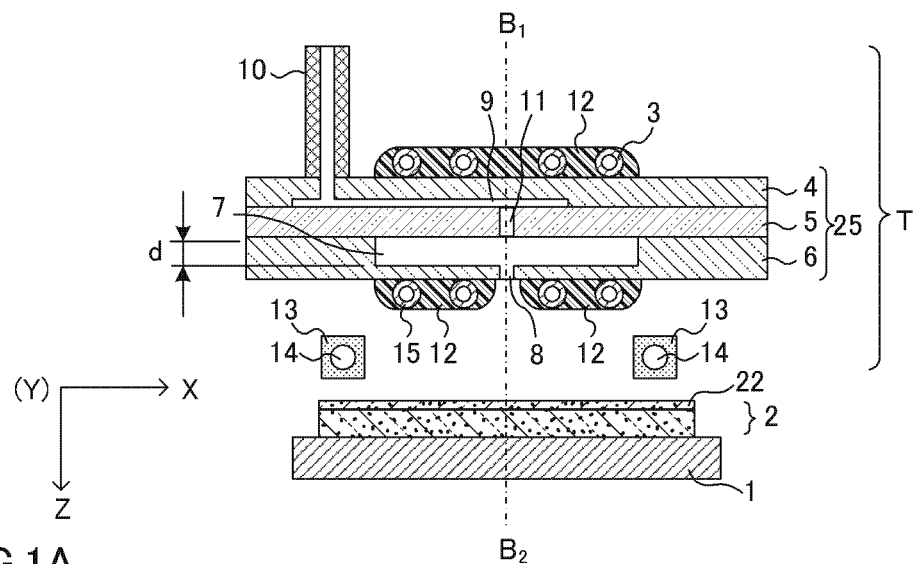
FIGS. 1A and 1B are cross-sectional views of a plasma processing apparatus according to a first embodiment.
Figure 1B:
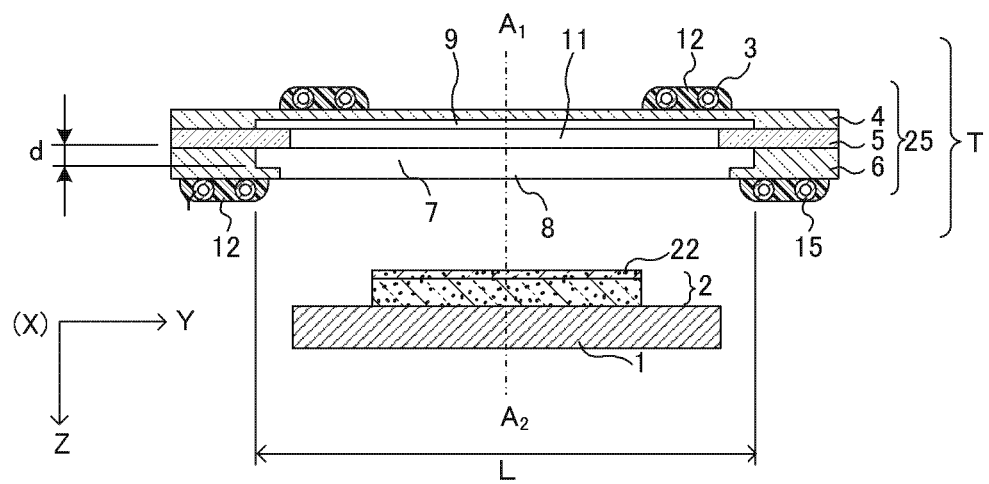

FIG. 1A is a cross-sectional view cut at a surface perpendicular to the longitudinal direction of an induction coupling-type plasma torch unit in a plasma processing apparatus according to the first embodiment. FIG. 1B is a cross-sectional view cut at a surface which is parallel with the longitudinal direction of the induction coupling-type plasma torch unit and perpendicular to a base material. FIG. 1B is a cross-sectional view cut along the dotted line $B_1$-$B_2$ in FIG. 1A, and FIG. 1A is a cross-sectional view cut along the dotted line $A_1$-$A_2$ in FIG. 1B.

Figure 2:
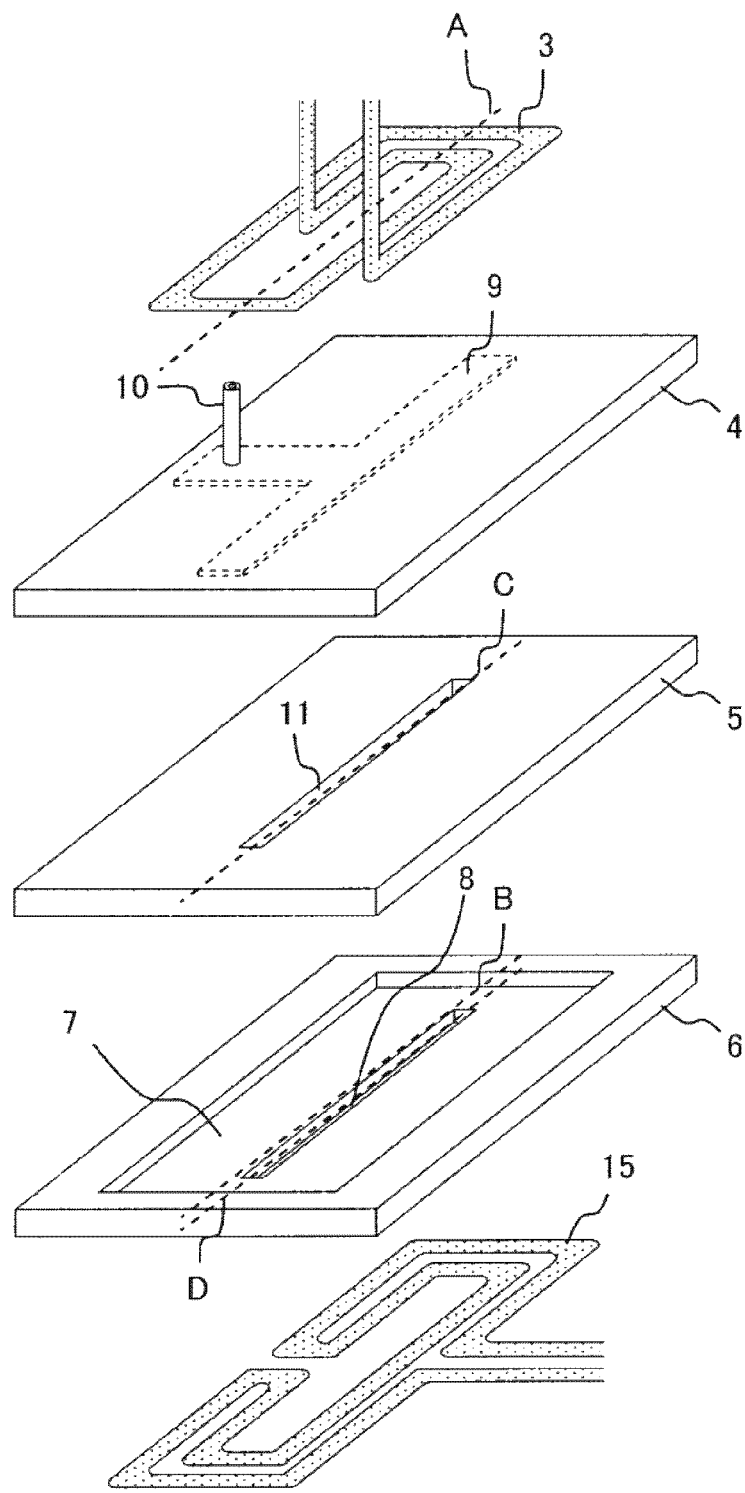
FIG. 2 is a perspective view of the plasma processing apparatus according to the first embodiment.

In addition, FIG. 2 is an assembly configuration view of the induction coupling-type plasma torch unit shown in FIG. 1, which also shows an array of perspective views of (part of) the respective components.

As shown in FIG. 1A, the plasma processing apparatus has a base material mounting table 1, a long chamber 25 which is disposed above the base material mounting table 1 and is formed of a dielectric member having a plasma generating area therein and a plasma ejection port at the bottom end in parallel with the longitudinal direction, a gas supply pipe 10 that introduces gas into the chamber 25, a spiral coil 3 having a long shape in parallel with the longitudinal direction of the chamber 25, a high-frequency electric power supply connected to the spiral coil 3, and a moving mechanism which enables the chamber and the base material mounting table to relatively move perpendicularly with respect to the longitudinal direction of a plasma ejection port 8.

The above configuration enables a treatment of all of the desired areas to be treated of a base material within a short period of time in a case in which (a) the vicinity of the surface of the base material is uniformly treated thermally at a high temperature only for a short period of time, or (b) plasma from reaction gas or plasma and a reaction gas flow are irradiated at the same time to the base material. Here, when the "depth of the chamber 25" is defined to be the "length of the chamber 25 in the depth direction with respect to the short direction and the longitudinal direction of the chamber 25 in the inside 7 of the chamber 25", the depth of the chamber 25 is preferably 0.5 mm to 7 mm, and more preferably 1 mm to 5 mm. This is because the plasma generation efficiency of the plasma processing apparatus becomes favorable.

In FIGS. 1A, 1B, and 2, a base material 2 is mounted on the base material mounting table 1. In an induction coupling-type plasma torch unit T, and the planar spiral coil 3 are preferably disposed in the vicinity of a first quartz plate 4 as a hollow conductive tube which forms the coil. This is because a plasma processing apparatus can be manufactured using a simple configuration. The long chamber 25 made of a dielectric material is demarcated using a space surrounded by a second quartz plate 5 and a third quartz plate 6 (a space inside the chamber 25).

The inner wall surface of the chamber 25 on a side near the spiral coil 3 is preferably a plane in parallel with the plane that the spiral coil 3 forms. This is because, in the above configuration, the distance from the spiral coil 3 to the chamber 25 becomes the same at an arbitrary portion of the spiral coil 3. That is, it becomes possible to generate induction coupling plasma using a small high-frequency electric power, and plasma can be efficiently generated.

As shown in FIG. 2, the chamber is preferably configured as a space sandwiched by two dielectric plates having a groove on at least one side. This is because the above configuration enables easy manufacturing of a plasma processing apparatus.

In addition, the external form of the chamber is preferably larger than the external form of the spiral coil 3. This is because the plasma generation efficiency of the plasma processing apparatus becomes favorable since the above requirement relates to the fact that the distance from the spiral coil 3 to the chamber 25 becomes the same at an arbitrary portion of the spiral coil 3.

The entire induction coupling-type plasma torch unit T is preferably surrounded by a shield member (not shown) made of a grounded conductor. This is because the leakage (noise) of high frequencies can be effectively prevented, and an abnormal discharge and the like which are not preferable can be effectively prevented.

The inside 7 of the chamber 25 is surrounded by a plane that forms a single surface of the second quartz plate 5 and the recess portion (groove) provided in the third quartz plate 6. That is, the entire chamber 25 is surrounded by a dielectric material. Plasma generated in the inside 7 of the chamber 25 is ejected toward the base material 2 from the plasma ejection port 8 which acts as a slit-shaped opening portion in the chamber 25. In addition, the longitudinal direction of the chamber 25 and the longitudinal direction of the plasma ejection port 8 are disposed in parallel.

In addition, the plasma ejection port 8 is preferably provided on the opposite side of the spiral coil 3 in the chamber 25.

A plasma gas manifold 9 surrounded by the recess portion (groove) provided in the first quartz plate 4 and the plane (the surface on the opposite side of the chamber 25) that forms a single surface of the second quartz plate 5 is provided. Gas supplied to the plasma gas manifold 9 from the plasma gas supply pipe 10 is introduced into the inside 7 of the chamber 25 through a plasma gas supply hole 11 which acts as a long gas introduction portion provided in the second quartz plate 5. The above configuration can easily realize a uniform gas flow in the longitudinal direction. The flux of gas introduced into the plasma gas supply pipe 10 is controlled using a flux control apparatus such as a mass flow controller provided upstream.

The plasma gas supply hole 11 is a long slit, but a plurality of the plasma gas supply holes having a round hole shape may be provided.

The spiral coil 3 is preferably adhered (joined) to the first quartz plate 4 using an adhesive 12. In addition, the central axis of the spiral coil 3 is disposed in parallel with the longitudinal direction of the chamber 25 and the longitudinal direction of the plasma ejection port 8.

In addition, a line which is parallel with the longitudinal direction of the spiral coil 3 and penetrates through the center of the spiral coil 3 (the dotted line A in FIG. 2), a line which is parallel with the longitudinal direction of the chamber 25 and penetrates through the center of the chamber 25 (the dotted line B in FIG. 2), a line which is parallel with the longitudinal direction of the plasma gas supply hole 11 and penetrates through the center of the plasma gas supply hole 11 (the dotted line C in FIG. 2), and a line which is parallel with the longitudinal direction of the plasma ejection port 8 and penetrates through the center of the plasma ejection port 8 (the dotted line D in FIG. 2) are preferably disposed in parallel with one another on the same plane. The above configuration can provide uniform plasma and minimize the volume of portions in which plasma is generated. As a result, the plasma generation efficiency of the plasma processing apparatus improves.

In addition, a shielding gas nozzle 13 is disposed as a shielding gas supply opening at a portion near the base material mounting table 1, and a shielding gas manifold 14 is preferably provided in the shielding gas nozzle. The supply of shielding gas separately from plasma gas which is suitable for generation of plasma by providing a two-path gas introduction system can decrease incorporation of gas which is not necessary for or has an adverse influence on the treatment, such as oxygen and carbon dioxide in the atmosphere, into plasma-irradiating surfaces. Meanwhile, the shielding gas supply opening may be a slit having a long shape in parallel with the longitudinal direction of the plasma ejection port 8. In addition, the shielding gas supply opening may be a plurality of holes arrayed in parallel with the longitudinal direction of the plasma ejection port 8.

The spiral coil 3 is hollow, and the inside thereof forms a cooling medium path. That is, inside the spiral coil 3, cooling water flows as a cooling medium so as to realize cooling of the spiral coil 3 and cooling of the first quartz plate 4 joined to the spiral coil. In addition, a water cooling tube 15 made of a conductor which acts as the cooling medium path is preferably provided on the opposite side of the spiral coil 3. By this, it is possible to effectively cool the plasma processing apparatus. In this case, the water cooling tube 15 is preferably joined to the third quartz plate 6 using the adhesive 12. This is because it is possible to cool the plasma processing apparatus more effectively. The water cooling tube 15 is electrically grounded, and is configured to facilitate ignition (lighting) of plasma.

The first quartz plate 4, the second quartz plate 5, and the third quartz plate 6 are preferably adhered (joined) to one another. This is because it is possible to effectively cool the induction coupling-type plasma torch unit by mutually increasing thermal conductivity.

Joining of the spiral coil 3 and the first quartz plate 4, joining of the water cooling tube 15 and the third quartz plate 6, joining of the first quartz plate 4 and the second quartz plate 5, and joining of the second quartz plate 5 and the third quartz plate 6 can be performed using a variety of adhesives as well as a welding method. In order to secure the cooling efficiency, in a case in which an adhesive is used, the adhesive is preferably coated as thinly and uniformly as possible.

Advantages of the configuration in which the spiral coil 3 and the water cooling tube 15 are joined to the first quartz plate 4 and the third quartz plate 6 respectively include (a) a fact that, since an existing plate material and an existing tube material can be used, the plates and the tubes can be manufactured at a low cost in a quick delivery manner, and (b) a fact that, since the distance between the chamber 25 and the cooling medium path can be decreased, the cooling efficiency is favorable. That is, according to the present embodiment, since the cross section of the cooling medium path is round, compared to a case in which water cooling is performed using the configuration of the double tube described in Patent Document 6, it is possible for a far larger amount of a cooling medium to flow, and therefore effective cooling is possible.

In addition, both ends of the spiral coil 3 are connected to a high-frequency matching circuit, not shown, through copper plates, not shown.

The rectangular slit-shaped plasma ejection port 8 is provided, and the base material mounting table 1 (or the base material 2 on the base material mounting table 1) is disposed opposite to the plasma ejection port 8. In this state, gas is supplied into the chamber 25. At the same time, a high-frequency electric power is supplied to the spiral coil 3 from a high-frequency power supply, not shown, while gas is ejected toward the base material 2 from the plasma ejection port 8. In addition, plasma is generated in the inside 7 of the chamber 25. Thereby, plasma is irradiated to the base material 2 from the plasma ejection port 8 so that a plasma processing can be performed on a thin film 22 on the base material 2. The base material 2 is preferably treated by relatively moving the chamber 25 and the base material mounting table 1 perpendicularly with respect to the longitudinal direction of the plasma ejection port 8. That is, the induction coupling-type plasma torch unit T or the base material mounting table 1 is preferably moved in the horizontal direction in FIG. 1A and in the perpendicular direction to the paper surface of FIG. 1B. This is because it is possible to perform a treatment of a large-scale substrate or the like within a short period of time without increasing the size of the plasma processing apparatus.

A variety of gases can be used as the gas supplied into the chamber 25, but an inert gas-dominant gas is desirable in consideration of the safety and ignition properties of plasma, the service life of members exposed to plasma, and the like. Among the above, argon (Ar) gas is typically used. In a case in which plasma is generated using only Ar, the plasma reaches a significantly high temperature (10,000 K or higher).

Meanwhile, in the configuration, since the length of the plasma ejection port 8 in the longitudinal direction is equal to or larger than the width of the base material 2, it is possible to treat all of thin films 22 in the vicinity of the surface of the base material 2 with a single round of scanning (a relative movement of the induction coupling-type plasma torch unit T and the base material mounting table 1).

Figure 3A:
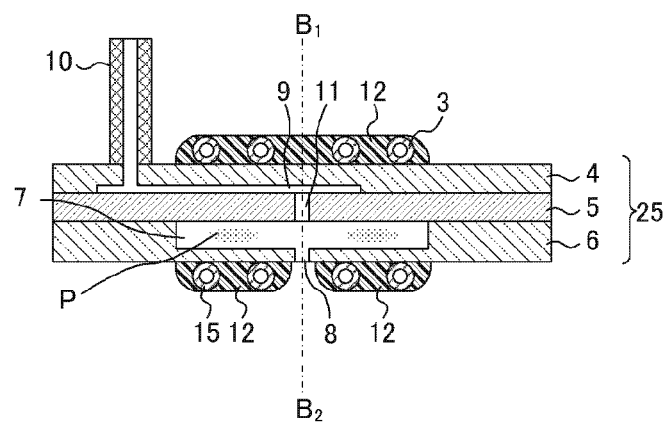
FIGS. 3A and 3B are cross-sectional views of the plasma processing apparatus according to the first embodiment.
Figure 3B:
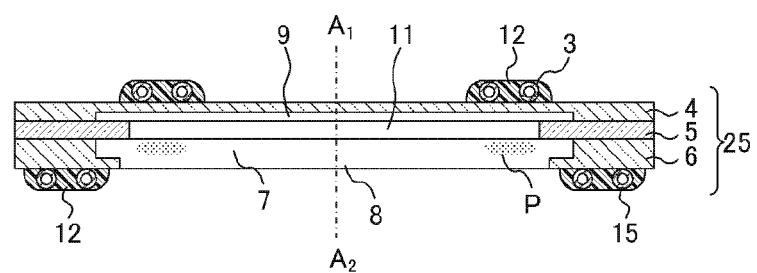

In such a plasma processing apparatus, Ar gas or a gas mixture (Ar+$H_2$) is continuously supplied into the chamber 25 through the gas ejection port, and gas is ejected from the plasma ejection port 8 toward the base material 2. At the same time, a high-frequency electric power of 13.56 MHz is supplied to the spiral coil 3 from the, not shown, high-frequency power supply. In addition, a high-frequency electromagnetic field is generated in the inside 7 of the chamber 25 so as to generate plasma. Thereby, it is possible to perform a thermal treatment such as crystallization of a semiconductor film by irradiating and scanning plasma to the base material 2 from the plasma ejection port 8. When induction-coupling thermal plasma is generated, a strongly light-emitting cyclic plasma ring P appears as shown in FIGS. 3A and 3B. The plasma ring P is formed along the shape of the spiral coil 3. The plasma ring P is considered to be an area having a particularly high plasma density and a particularly high gas temperature. Meanwhile, FIG. 3A is the same cross section as FIG. 1A, and FIG. 3B is the same cross section as FIG. 1B.

Preferable conditions for generation of plasma are the distance between the plasma ejection port 8 and the base material 2=3 mm to 50 mm, scanning rate: 50 mm/s to 3000 mm/s, the total flux of plasma gas=1 SLM to 100 SLM, the concentration of $H_2$ in the gas mixture (Ar+$H_2$)=0% to 10%, shielding gas (N2) flux=1 SLM to 100 SLM, and high-frequency electric power=approximately 0.5 kW to 10 kW. However, among the above various amounts, the gas flux and the electric power are values per the length of the plasma ejection port 8 of 100 mm. This is because it is considered that it is appropriate to inject the amounts proportionate to the length of the plasma ejection port 8 as the parameters of the gas flux, the electric power, or the like.

It is preferable to make the chamber 25 and the base material mounting table 1 relatively movable perpendicularly with respect to the longitudinal direction of the plasma ejection port 8 while the longitudinal direction of the plasma ejection port 8 and the base material mounting table 1 are disposed in parallel. This is because it is possible to configure the apparatus so that the length of the plasma to be generated and the treatment length of the base material 2 become almost the same. In addition, the width of a cross section of the chamber 25 cut at a surface perpendicular to the central axis of the chamber 25 (the width of the inside 7 of the chamber 25 in FIG. 1A) may be slightly larger than the width of the plasma ejection port 8 (the width of the gap in FIG. 1A). That is, the volume of plasma to be generated can be extremely decreased compared to in the related art. As a result, the power efficiency significantly increases.

As shown in FIGS. 1A and 1B, when the "depth of the chamber 25" is defined to be the "length of the chamber 25 in the depth direction Z with respect to the short direction X and longitudinal direction Y of the chamber 25 in the inside 7 of the chamber 25", the "depth of the chamber 25" corresponds to "d". In a test performed under the atmosphere with the length L of the inside 7 of the chamber 25 in the longitudinal direction Y set to 95 mm and the depth d of the chamber 25 being varied, generation of thermal plasma using Ar gas was successful at a high-frequency electric power of 10 kW or less when the depth d of the chamber 25 was 1 mm to 5 mm. It is considered that, when the high-frequency electric power is further increased, thermal plasma is generated even at a depth d of the chamber 25 of 0.5 mm to 7 mm, however, outside the above range, an induction-coupling plasma processing at atmospheric pressure is difficult.

From the test results, it can be said that the depth d of the chamber 25 is desirably 0.5 mm to 7 mm, and, more preferably, the depth d of the chamber 25 is desirably 1 mm to 5 mm.

The above fact indicates that the volume of the inside 7 of the chamber 25 may be small, and it is considered that a high power efficiency can be obtained compared to in the related art.

In addition, in the inside 7 of the chamber 25, since relatively uniform plasma can be generated in the longitudinal direction, it is possible to treat the base material uniformly compared to the example of the related art disclosed in Patent Document 6 and the like.

(Plasma Processing Method)

Next, a plasma processing method using the plasma processing apparatus according to the first embodiment will be described.

(a) Firstly, the plasma processing apparatus as shown in FIGS. 1A and 1B is prepared.

(b) Next, gas is injected from the gas supply pipe 10. In addition, the gas is introduced into the inside 7 of the chamber 25 through a gas pipe 9. As the gas supplied into the chamber 25, a variety of gases can be used. When the safety and ignition properties of plasma, the service life of members exposed to plasma, and the like are taken into account, the gas desirably includes mainly an inert gas. For example, argon (Ar) gas or a gas mixture (Ar+$H_2$) can be used. Among the above, Ar gas is preferable. Meanwhile, in a case in which plasma is generated using only Ar gas, the plasma reaches a significantly high temperature (10,000 K or higher).

(c) High-frequency electric power of 13.56 MHz is supplied to the coil 3 disposed at the outer circumference of the chamber 25. In addition, a high-frequency electromagnetic field is generated in the chamber 25. In addition, plasma is generated in the chamber 25. Meanwhile, the process (c) may be performed at the same time as the process (b), but is preferably performed after the process (b).

(d) Meanwhile, the base material 2 is prepared, and the base material 2 is disposed on the base material mounting table 1 of FIG. 1A. The process (d) is preferably performed at a location away from the chamber 25, for example, at the side of the chamber 25, or the like.

(e) The chamber 25 is disposed above the base material 2, the plasma generated in the inside 7 of the chamber 25 is irradiated to the base material 2 from the plasma ejection port 8. In addition, a plasma processing is performed on the surface of the base material 2 using the plasma.

(f) The base material 2 and the chamber 25 are relatively moved perpendicularly with respect to the longitudinal direction of the plasma ejection port 8, and the base material 2 is scanned using the chamber 25. The process (f) may be performed at the same time as the process (e), but the chamber 25 is preferably scanned over the base material 2 when the moving rate of the chamber 25 becomes constant.

(g) In the plasma processing process, the depth of the chamber 25 is set to 0.5 mm to 7 mm, and more preferably 1 mm to 5 mm. This is because the plasma generation efficiency of the plasma processing apparatus becomes favorable.

Using the above processes, a plasma processing can be performed on the thin film 22 on the base material 2. In addition, it is possible to perform a plasma processing such as a thermal treatment, thermal spraying, film formation, and etching by irradiating plasma to the base material 2 from the plasma ejection port 8.

(Embodiment 2)

Figure 4:
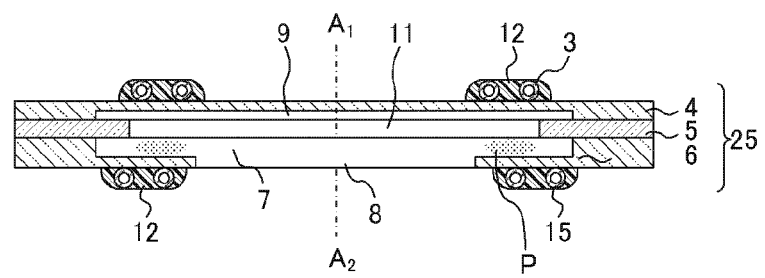
FIG. 4 is a cross-sectional view of a plasma processing apparatus according to a second embodiment.

FIG. 4 is a cross-sectional view of a plasma processing apparatus according to a second embodiment which is cut at a surface that is in parallel with the longitudinal direction of an induction coupling-type plasma torch unit and is perpendicular to a base material.

Since the size of the plasma ejection port 8 in the longitudinal direction is the only difference between the first embodiment and the second embodiment, other parts will not be described.

In FIG. 1, the size of the plasma ejection port 8 in the longitudinal direction is relatively large, and the opening portion extends up to the outside of the generation location of the plasma ring P. That is, the linear portion formed by the opening portion is disposed so as to extend up to the outside of the portion that composes the short direction of the spiral coil 3. In such a configuration, when the flux of the plasma gas increases, the plasma ring P almost flies out toward the base material 2 from the plasma ejection port 8, and there were cases in which the plasma became unstable. In the second embodiment, the size of the plasma ejection port 8 in the longitudinal direction is relatively small, and the opening portion extends only up to the inside of the generation location of the plasma ring P. That is, the linear portion formed by the opening portion is preferably disposed in the inside of the portion that composes the short direction of the spiral coil 3. This is because more stable generation of plasma can be realized in the above configuration. That is, even in a case in which the flux of plasma is increased, it becomes difficult for the plasma ring P to almost fly out toward the base material 2 from the plasma ejection port 8, and there is an advantage that the plasma does not easily become unstable.

(Embodiment 3)

Figure 5:
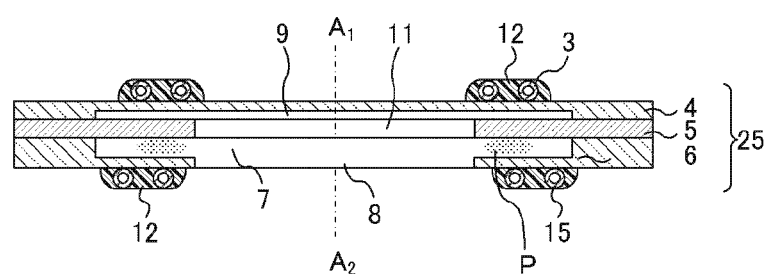
FIG. 5 is a cross-sectional view of a plasma processing apparatus according to a third embodiment.

FIG. 5 is a cross-sectional view of a plasma processing apparatus according to a third embodiment which is cut at a surface that is perpendicular to the longitudinal direction of an induction coupling-type plasma torch unit. FIG. 5 corresponds to FIG. 1B.

In FIGS. 1 and 4, the size of the plasma gas supply hole 11 in the longitudinal direction is relatively large, and the gas introduction portion extends up to the outside of the generation location of the plasma ring P. That is, the linear portion that forms the plasma gas supply hole 11 toward the chamber 25 is disposed so as to extend up to the outside of the portion that composes the short direction of the spiral coil 3. In such a configuration, when the flux of the plasma gas increases, the plasma ring P becomes almost flown out toward the base material 2 from the plasma ejection port 8, and there were cases in which the plasma became unstable. In the third embodiment, the size of the plasma gas supply hole 11 in the longitudinal direction is relatively small, and the gas introduction portion extends only up to the inside of the generation location of the plasma ring P. That is, the linear portion that forms the plasma gas supply hole 11 toward the chamber 25 is disposed in the inside of the portion that composes the short direction of the spiral coil 3.

In this case, even in a case in which the flux of the plasma gas is increased, it becomes difficult for the plasma ring P to become almost flown out toward the base material 2 from the plasma ejection port 8, and there is an advantage that the plasma does not easily become unstable.

In the third embodiment, furthermore, the configuration described in the second embodiment is employed, and generation of plasma can be performed more stably.

(Embodiment 4)

Figure 6:
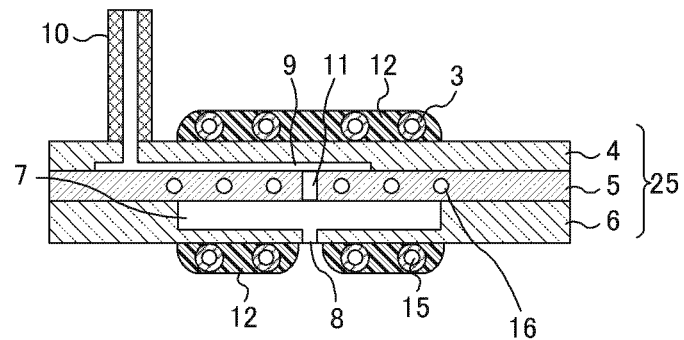
FIG. 6 is a cross-sectional view of a plasma processing apparatus according to a fourth embodiment.

FIG. 6 is a cross-sectional view of a plasma processing apparatus according to a fourth embodiment which is cut at a surface that is perpendicular to the longitudinal direction of an induction coupling-type plasma torch unit. FIG. 6 corresponds to FIG. 1A.

In FIG. 6, long penetrating holes 16 are provided in parallel with the longitudinal direction of the plasma ejection port 8 in the second quartz plate 5, and the plasma processing apparatus is configured to let cooling medium flow in the penetrating holes 16. The above configuration can realize cooling of the second quartz plate 5 more effectively.

(Embodiment 5)

Figure 7:
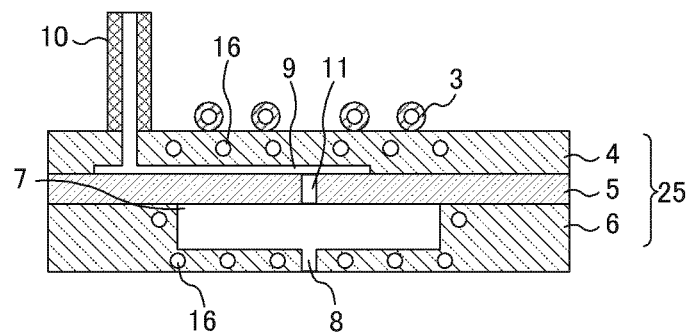
FIG. 7 is a cross-sectional view of a plasma processing apparatus according to a fifth embodiment.

FIG. 7 is a cross-sectional view of a plasma processing apparatus according to a fifth embodiment which is cut at a surface that is perpendicular to the longitudinal direction of an induction coupling-type plasma torch unit. FIG. 7 corresponds to FIG. 1A.

In FIG. 7, the long penetrating holes 16 are provided in parallel with the longitudinal direction of the plasma ejection port 8 in the first quartz plate 4 and the third quartz plate 6, and the plasma processing apparatus is configured to let cooling medium flow into the penetrating holes 16. The above configuration can effectively realize cooling of the first quartz plate 4 and the third quartz plate 6.

(Embodiment 6)

Figure 8:
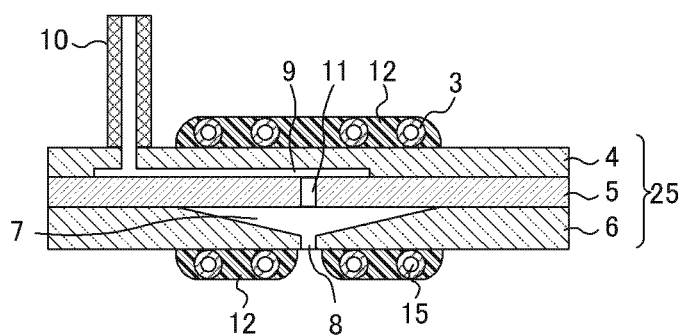
FIG. 8 is a cross-sectional view of a plasma processing apparatus according to a sixth embodiment.

FIG. 8 is a cross-sectional view of a plasma processing apparatus according to a sixth embodiment which is cut at a surface that is perpendicular to the longitudinal direction of an induction coupling-type plasma torch unit. FIG. 8 corresponds to FIG. 1A.

In FIG. 8, the inside 7 of the chamber 25 is configured so as to become gradually narrower from the plasma gas supply hole 11 toward the plasma ejection port 8. Since the above configuration can further decrease the volume of the inside 7 of the chamber 25, a high power efficiency can be obtained.

(Embodiment 7)

Figure 9:
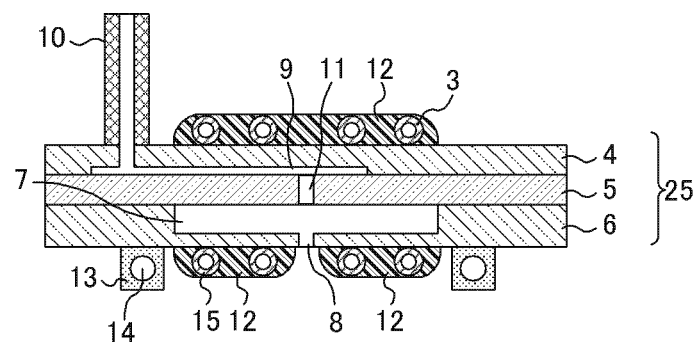
FIG. 9 is a cross-sectional view of a plasma processing apparatus according to a seventh embodiment.

FIG. 9 is a cross-sectional view of a plasma processing apparatus according to a seventh embodiment which is cut at a surface that is perpendicular to the longitudinal direction of an induction coupling-type plasma torch unit. FIG. 9 corresponds to FIG. 1A.

In FIG. 9, the shielding gas nozzle 13 having the shielding gas manifold 14 therein is disposed so as to be in contact with the third quartz plate 6. The above configuration can further decrease the size of the induction coupling-type plasma torch unit T.

(Embodiment 8)

Figure 10:
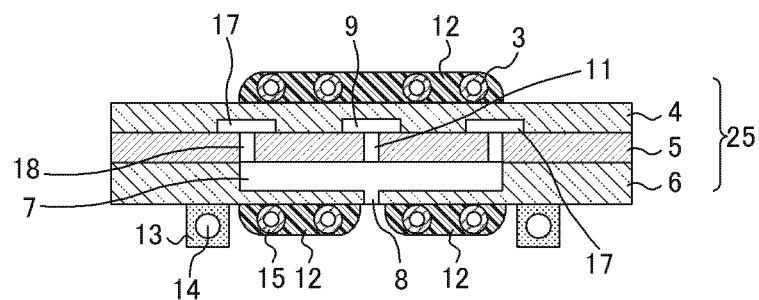
FIG. 10 is a cross-sectional view of a plasma processing apparatus according to an eighth embodiment.

FIG. 10 is a cross-sectional view of a plasma processing apparatus according to an eighth embodiment which is cut at a surface that is perpendicular to the longitudinal direction of an induction coupling-type plasma torch unit. FIG. 10 corresponds to FIG. 1A.

In FIG. 10, sheath gas can be supplied as well as the plasma gas and the shielding gas. That is, two sheath gas manifolds 17 surrounded by the recess portion (groove) provided in the first quartz plate 4 and the plane that forms a single surface of the second quartz plate 5 (the surface on the opposite side of the chamber 25) are provided so as to sandwich the plasma gas manifold 9. Gas supplied to the sheath gas manifold 17 is introduced into the inside 7 of the chamber 25 along the outer circumferential portion of the chamber 25 through the sheath gas supply holes 18 which act as the long gas introduction portion provided in the second quartz plate 5. The above configuration can effectively protect the surfaces of the second quartz plate 5 and the third quartz plate 6 which compose the inner wall surfaces of the chamber 25 from thermal plasma.

(Embodiment 9)

Figure 11:
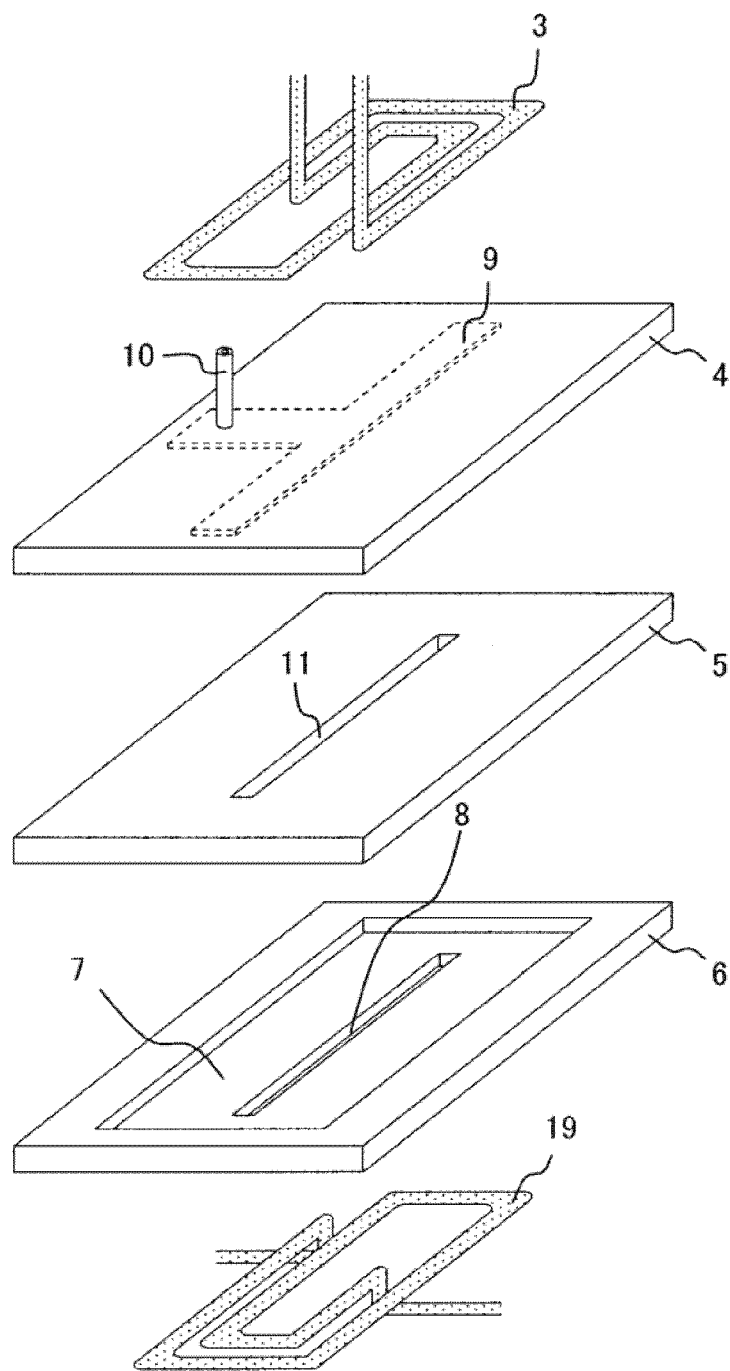
FIG. 11 is a perspective view of a plasma processing apparatus according to a ninth embodiment.

FIG. 11 is an assembly configuration view of an induction coupling-type plasma torch unit in a plasma processing apparatus according to a ninth embodiment, which also shows an array of perspective views of (part of) the respective components.

In FIG. 11, a second spiral coil 19 is provided instead of the water cooling tube 15. That is, two of the spiral coils are provided, and the chamber 25 is sandwiched between the two coils. On the two coils, wires are provided or the phase control of the high-frequency power supply is performed so that an electric current having the same phase is made to flow in the circumferential direction. Then, a stronger electromagnetic field is generated in the inside 7 of the chamber 25, and it becomes possible to generate plasma having a higher temperature.

(Embodiment 10)

Figure 12:
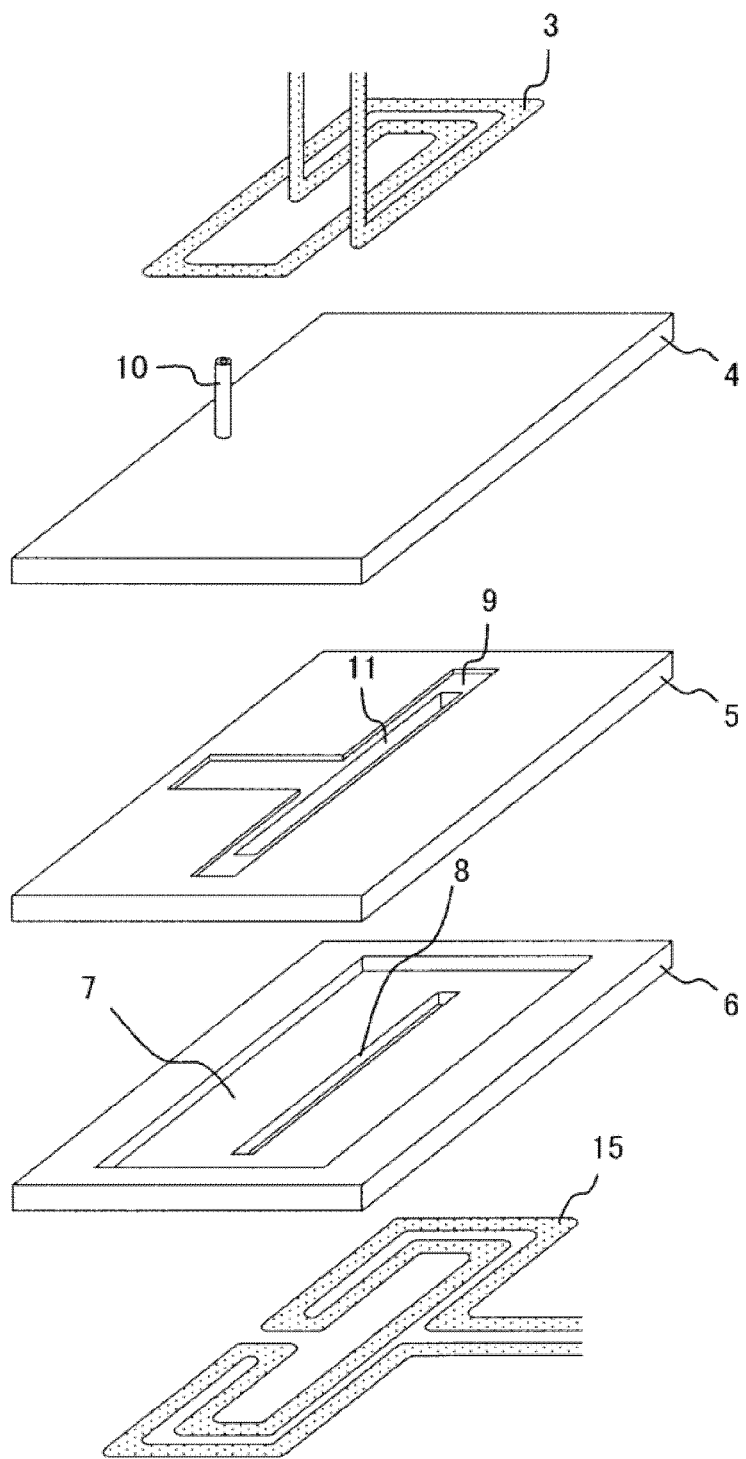
FIG. 12 is a perspective view of a plasma processing apparatus according to a tenth embodiment.

FIG. 12 is an assembly configuration view of an induction coupling-type plasma torch unit in a plasma processing apparatus according to a tenth embodiment, which also shows an array of perspective views of (part of) the respective components.

In FIG. 12, the plasma gas manifold 9 surrounded by the recess portion (groove) provided in the second quartz plate 5, not in the first quartz plate 4, and the plane (the surface facing the chamber 25) that forms a single surface of the first quartz plate 4 is provided. Gas supplied to the plasma gas manifold 9 from the plasma gas supply pipe 10 is introduced into the inside 7 of the chamber 25 through the plasma gas supply hole 11 (penetrating hole) which acts as the long gas introduction portion provided in the second quartz plate 5.

(Embodiment 11)

Figure 13:
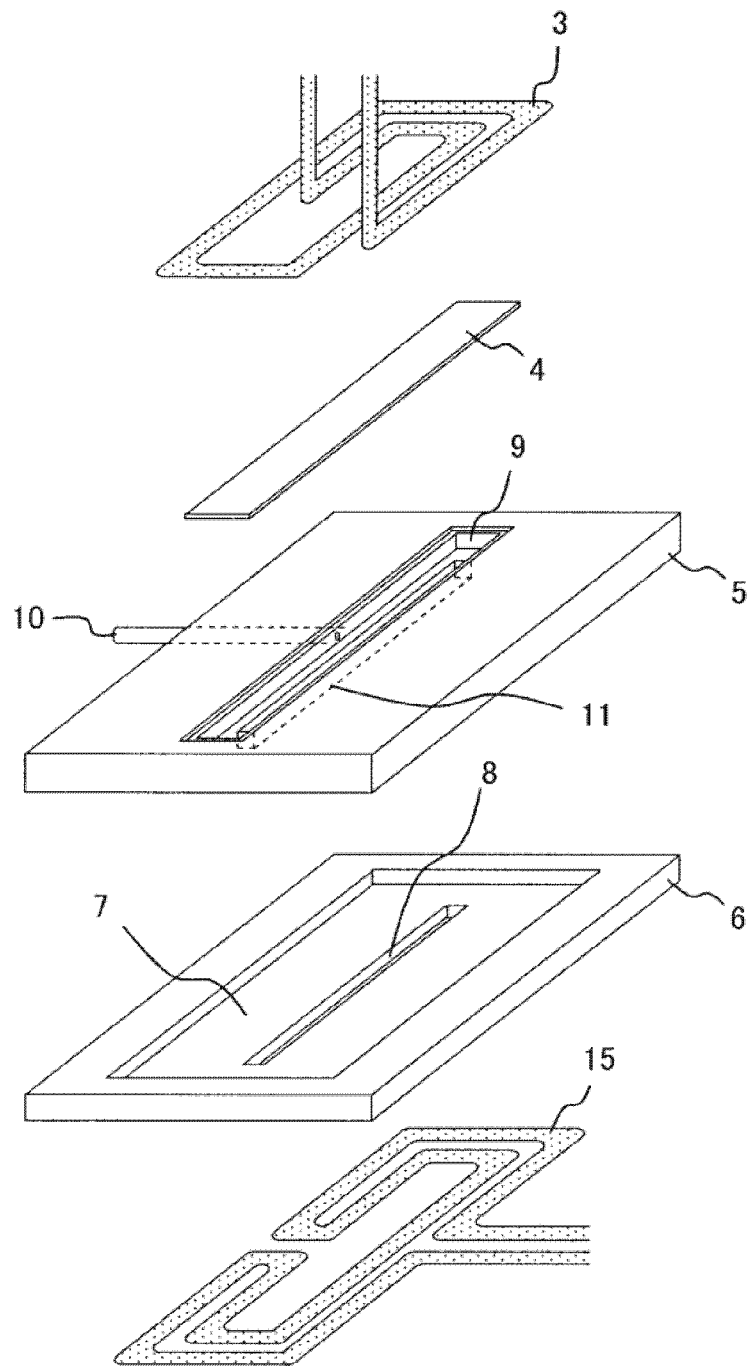
FIG. 13 is a perspective view of a plasma processing apparatus according to an eleventh embodiment.
Figure 14A:
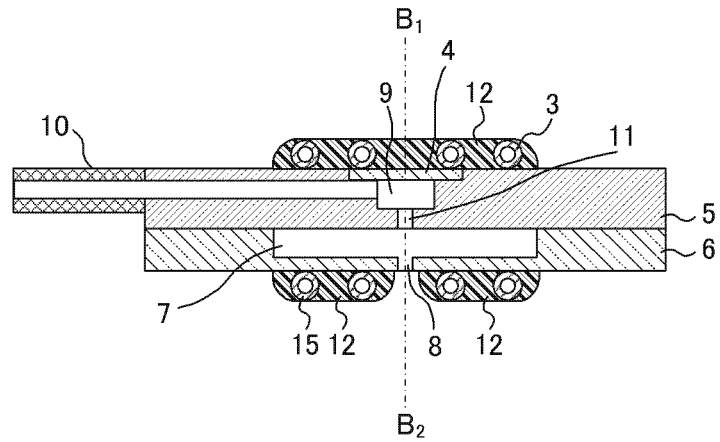
FIGS. 14A and 14B are cross-sectional views of the plasma processing apparatus according to the eleventh embodiment.
Figure 14B:
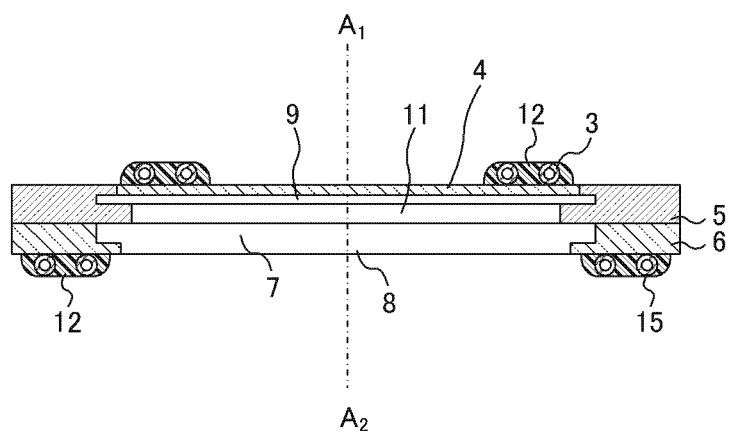

FIG. 13 is an assembly configuration view of an induction coupling-type plasma torch unit in a plasma processing apparatus according to an eleventh embodiment, which also shows an array of perspective views of (part of) the respective components. In addition, FIG. 14A is a cross-sectional view which is cut at a surface that is perpendicular to the longitudinal direction of the induction coupling-type plasma torch unit. FIG. 14B is a cross-sectional view which is cut at a surface that is in parallel with the longitudinal direction of the induction coupling-type plasma torch unit, and is perpendicular to the base material. FIG. 14B is a cross-sectional view cut along the dotted line $B_1$-$B_2$ in FIG. 14A, and FIG. 14A is a cross-sectional view cut along the dotted line $A_1$-$A_2$ in FIG. 14B.

In FIGS. 13 and 14, the plasma gas manifold 9 surrounded by the recess portion (groove) provided in the second quartz plate 5 and the plane (the surface facing the chamber 25) that forms a single surface of the first quartz plate 4 is provided. However, the first quartz plate 4 is extremely thin and configured to have a size that only covers the plasma gas manifold 9, and the first quartz plate 4 and the second quartz plate 5 are adhered to each other. In addition, the plasma gas supply pipe 10 is provided on the side of the second quartz plate 5. Since the above configuration can directly cool the second quartz plate 5 that composes the inner wall surface of the chamber 25 using a cooling medium that flows through the spiral coil 3, the cooling efficiency increases.

(Embodiment 12)

Figure 15:
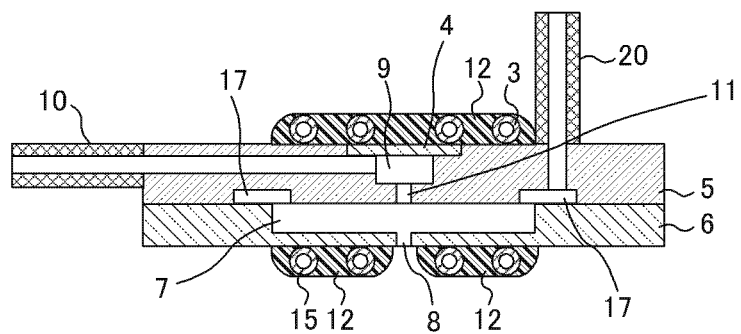
FIG. 15 is a cross-sectional view of a plasma processing apparatus according to a twelfth embodiment.

FIG. 15 is a cross-sectional view of a plasma processing apparatus according to a twelfth embodiment which is cut at a surface that is perpendicular to the longitudinal direction of an induction coupling-type plasma torch unit. FIG. 15 corresponds to FIG. 1A.

In FIG. 15, the plasma gas manifold 9 surrounded by the recess portion (groove) provided in the second quartz plate 5 and the plane (the surface facing the chamber 25) that forms a single surface of the first quartz plate 4 is provided. The twelfth embodiment is the same as the eleventh embodiment regarding the fact that the first quartz plate 4 is extremely thin and configured to have a size that barely covers the plasma gas manifold 9.

Furthermore, similarly to the eighth embodiment, the sheath gas can be supplied as well as the plasma gas and the shielding gas. That is, two sheath gas manifolds 17 surrounded by the recess portion (groove) provided in the second quartz plate 5 and the plane that forms a single surface of the third quartz plate 6 (the surface facing the chamber 25) are provided so as to sandwich the plasma gas manifold 9. Gas supplied to the sheath gas manifold 17 from a sheath gas supply pipe 20 is introduced into the inside 7 of the chamber 25 from the outer circumferential portion of the chamber 25 through which the inside portion of the recess portion provided in the second quartz plate 5 and the inside 7 of the chamber 25 penetrate. The above configuration can effectively protect the surfaces of the second quartz plate 5 and the third quartz plate 6 which compose the inner wall surfaces of the chamber 25 from thermal plasma.

(Embodiment 13)

Figure 16:
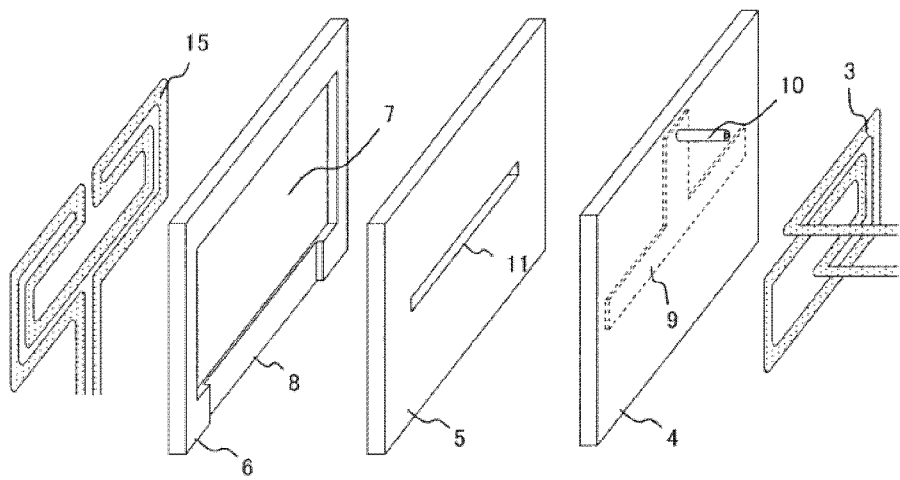
FIG. 16 is a perspective view of a plasma processing apparatus according to a thirteenth embodiment.

FIG. 16 is an assembly configuration view of an induction coupling-type plasma torch unit in a plasma processing apparatus according to a thirteenth embodiment, which also shows an array of perspective views of (part of) the respective components. In addition, FIG. 17 is a cross-sectional view which is cut at a surface that is perpendicular to the longitudinal direction of the induction coupling-type plasma torch unit.

Figure 17:
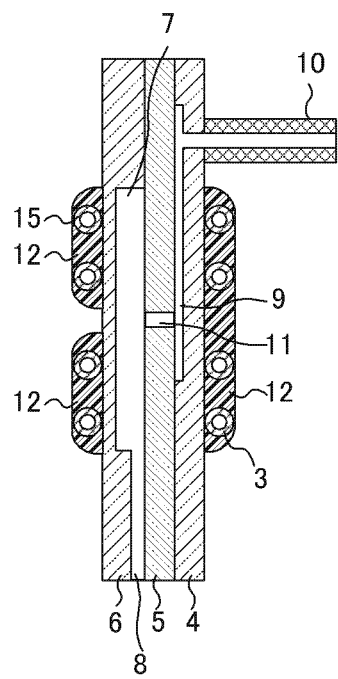
FIG. 17 is a cross-sectional view of the plasma processing apparatus according to the thirteenth embodiment.

In FIGS. 16 and 17, the disposition of the plasma ejection port 8 which acts as the opening portion is different from those in the first to twelfth embodiments. That is, the orientation from the plasma ejection port 8 to the chamber 25 and the orientation from the spiral coil 3 to the chamber 25 are perpendicular to each other.

(Embodiment 14)

Figure 18A:
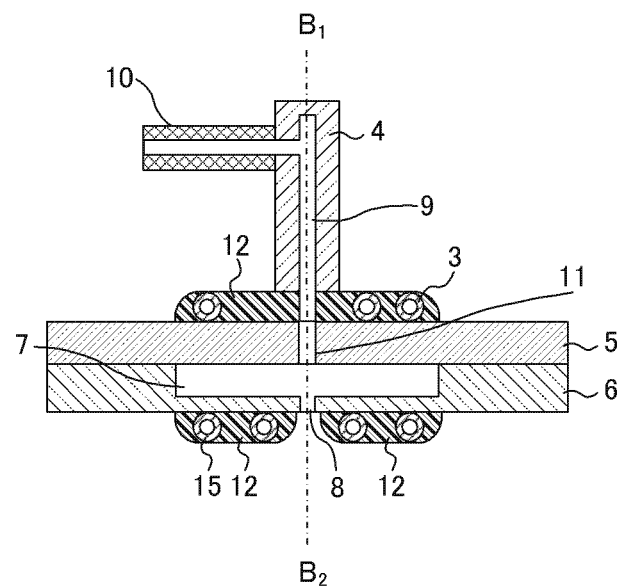
FIGS. 18A and 18B are cross-sectional views of a plasma processing apparatus according to a fourteenth embodiment.
Figure 18B:
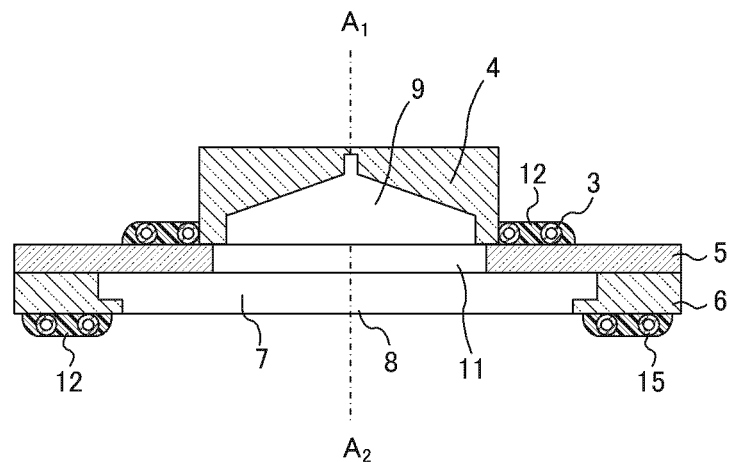

FIG. 18A is a cross-sectional view of a plasma processing apparatus according to a fourteenth embodiment which is cut at a surface that is perpendicular to the longitudinal direction of the induction coupling-type plasma torch unit. FIG. 18B is a cross-sectional view which is cut at a surface that is in parallel with the longitudinal direction of the induction coupling-type plasma torch unit, and is perpendicular to the base material. FIG. 18B is a cross-sectional view cut along the dotted line $B_1$-$B_2$ in FIG. 18A, and FIG. 18A is a cross-sectional view cut along the dotted line $A_1$-$A_2$ in FIG. 18B. In addition, FIG. 19 is an assembly configuration view of the induction coupling-type plasma torch unit shown in FIGS. 18A and 18B, which also shows an array of perspective views of (part of) the respective components.

Figure 19:
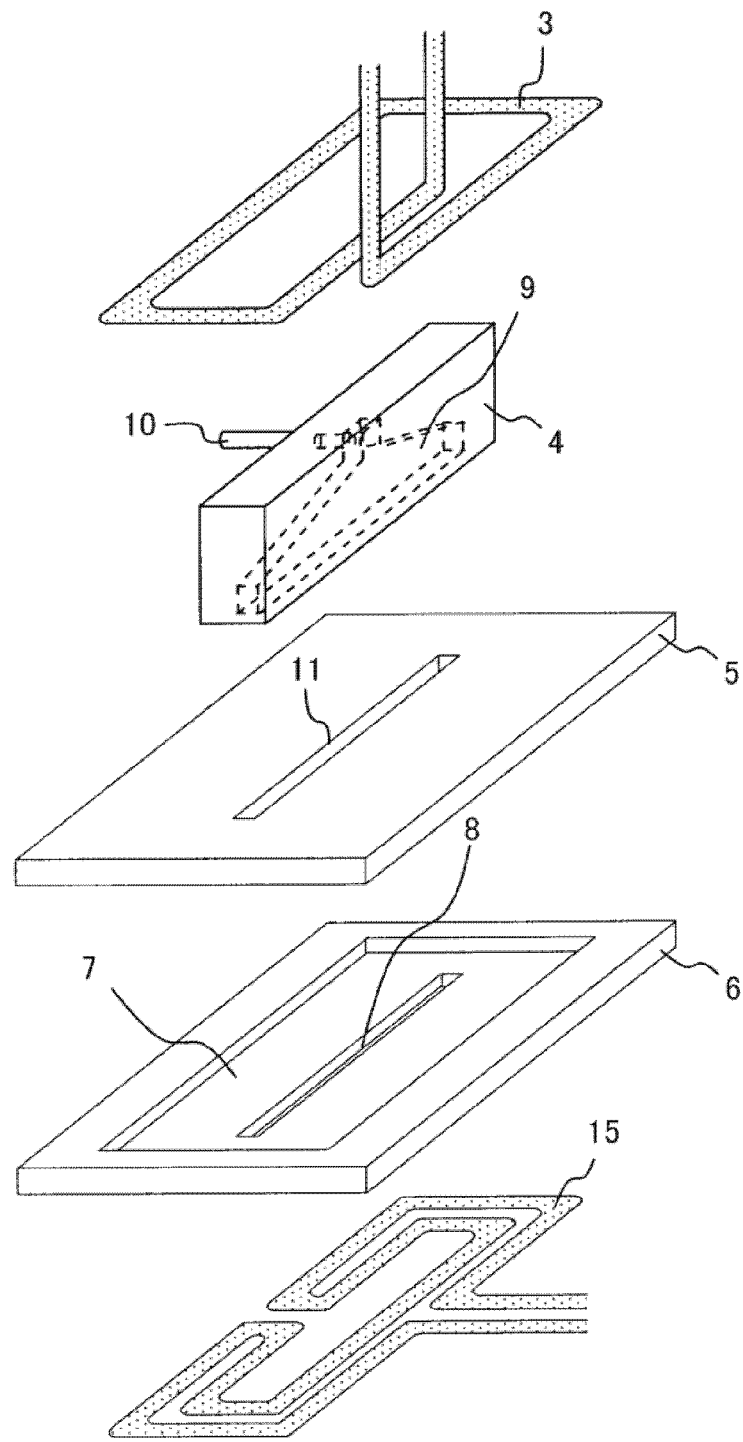
FIG. 19 is a perspective view of the plasma processing apparatus according to the fourteenth embodiment.
Figure 20:
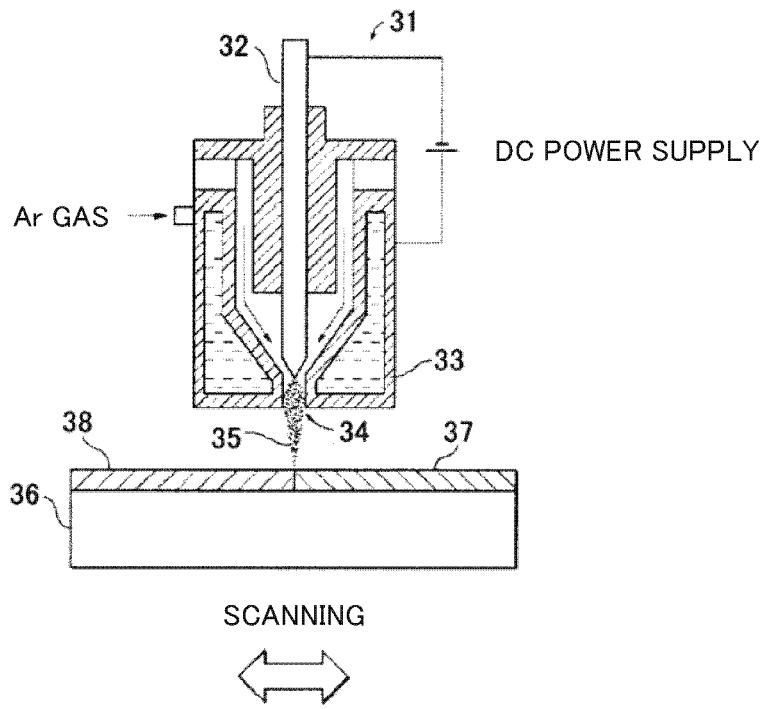
FIG. 20 is a cross-sectional view of a plasma processing apparatus according to an example of the related art.
Figure 21:
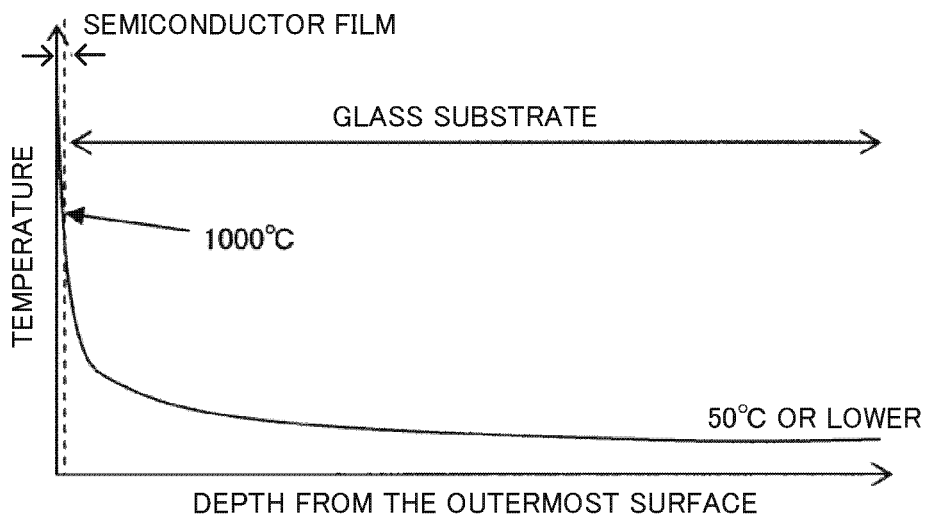
FIG. 21 is a conceptual view showing the relationship between the depth from the outermost surface and temperature in the example of the related art.

In FIGS. 18A, 18B, and 19, the plasma gas manifold 9 having a long hanger shape in an orientation which is the same as the longitudinal direction of the plasma ejection port 8 is formed inside the first quartz plate 4. Since the above configuration can directly cool the second quartz plate 5 that composes the inner wall surface of the chamber 25 using a cooling medium that flows through the spiral coil 3, the cooling efficiency increases. In addition, since a capacity-coupling electromagnetic field generated in the plasma gas manifold 9 becomes weak, there is an advantage that plasma is not generated easily in the plasma gas manifold.

(Other Embodiments)

The plasma processing apparatuses and the plasma processing methods described above simply exemplify the typical examples within the scope of the application of the invention.

For example, the induction coupling-type plasma torch unit T may be scanned against the fixed base material mounting table 1, but the base material mounting table 1 may also be scanned against the fixed induction coupling-type plasma torch unit T.

In addition, a case in which the spiral coil 3 is planar has been exemplified, but the spiral coil 3 may not be planar. For example, the plasma processing apparatus may have a configuration in which a so-called hanging bell-type spiral coil in which the distance between the spiral coil 3 and the first quartz plate 4 gradually increases toward the central portion of the swirl is used.

In addition, a case in which the water cooling tube 15 is electrically grounded has been exemplified, but a tube made of an insulating material may be used. Particularly, when a water cooling tube made of a conductor is disposed in the vicinity of the plasma ejection port 8, there are cases in which an abnormal discharge results. Therefore, it is also possible, for example, to dispose a water cooling tube made of an insulating material in the vicinity of the plasma ejection port 8 and dispose a water cooling tube made of a conductor which is grounded at a location away from the plasma ejection port 8.

In addition, using a variety of the configurations of the invention, it becomes possible to treat the vicinities of the surface of the base material 2 at a high temperature. Therefore, the invention can be applied to the crystallization of a TFT semiconductor film or the modification of a solar cell semiconductor film which has been described in detail in the examples of the related art. Additionally, the invention can be applied to a variety of surface treatments such as the cleaning or degassing reduction of a protective layer in a plasma display panel, the surface flattening or degassing reduction of a dielectric layer composed of a collection of silica fine particles, the reflow of a variety of electric devices, and plasma doping using a solid impurity source. In addition, as a method of manufacturing a solar cell, the invention can also be applied to a method in which powder obtained by crushing a silicon ingot is coated on a base material, and melted by irradiating plasma, thereby obtaining a polycrystalline silicon film.

In addition, use of an ignition source is also possible in order to facilitate the ignition of plasma. As the ignition source, an ignition spark apparatus which is used in a gas water heater or the like can be used.

In addition, a term of "thermal plasma" has been used in the description for simplicity, but it is difficult to strictly differentiate thermal plasma and low-temperature plasma. In addition, for example, as described in "Non-equilibrium in thermal plasma", Yasunori Tanaka, Journal of Plasma and Fusion Research, Vol. 82, No. 8 (2006), pp. 479 to 483, it is also difficult to differentiate the kinds of plasma using only thermal equilibrium. An object of the invention is a thermal treatment of a base material, and the invention can be applied to matters relating to techniques that irradiate high-temperature plasma regardless of terminologies such as thermal plasma, thermal equilibrium plasma, and high-temperature plasma.

In addition, a case in which the vicinities of the surface of the base material are uniformly treated thermally at a high temperature only within an extremely short period of time has been exemplified, the invention can be applied even to a case in which a low-temperature plasma processing is performed on a base material by irradiating plasma from reaction gas or plasma and a reaction gas flow at the same time to the base material. When the reaction gas is mixed with the plasma gas, plasma from the reaction gas is irradiated to the base material, and etching or CVD can be realized. Alternatively, it is also possible to irradiate plasma and a reaction gas flow to a base material at the same time, and realize a plasma processing such as etching, CVD, or doping by using a noble gas or a gas obtained by adding a small amount of $H_2$ gas to a noble gas as the plasma gas, and supplying a gas including the reaction gas as the shielding gas.

When a gas mainly including argon gas is used as the plasma gas, as described in detail in the examples, thermal plasma is generated. Meanwhile, when a gas mainly including helium gas is used as the plasma gas, it is possible to generate plasma having a relatively low temperature. Using such a method, a treatment such as etching or film formation becomes possible without heating a base material too much.

Examples of the reaction gas used for etching include halogen-containing gases such as $C_xF_y$ (x and y are natural numbers) and $SF_6$, and it is possible to perform etching of silicon or a silicon compound. When $O_2$ is used as the reaction gas, removal of an organic substance, resist ashing, and the like become possible. Examples of the reaction gas used for CVD include monosilane, disilane, and the like, and formation of a silicon or silicon compound film becomes possible. Alternately, when a gas mixture of an organic gas including silicon represented by tetraethoxysilane (TEOS) and $O_2$ is used, it is possible to form a silicon oxidized film.

Additionally, a variety of low-temperature plasma processing such as a surface treatment that modifies water repellency or hydrophilic properties are possible. When compared to a technique of the related art (for example, the technique described in Patent Document 7), since the invention is an induction coupling type so that it is difficult to transit to an arc discharge even when a high power density per unit volume is injected, and therefore higher-density plasma can be generated, and, consequently, a fast reaction rate is obtained, and it becomes possible to treat all of desired areas to be treated of a base material can be treated within a short period of time.

INDUSTRIAL APPLICABILITY

As described above, the invention can be applied to crystallization of a TFT semiconductor film or the modification of a solar cell semiconductor film. Needless to say, in a variety of surface treatments such as the cleaning or degassing reduction of a protective layer in a plasma display panel, the surface flattening or degassing reduction of a dielectric layer composed of a collection of silica fine particles, the reflow of a variety of electric devices, and plasma doping using a solid impurity source, the invention is useful to treat all of desired areas to be treated of a base material within a short period of time when the vicinities of the surface of the base material are uniformly treated thermally at a high temperature only within an extremely short period of time.

In addition, the invention is useful to treat all of desired areas to be treated of a base material within a short period of time in a low-temperature plasma processing such as etching, film formation, doping, or surface modification when a variety of electronic devices and the like are manufactured.

The present application claims priority based on a Japanese Patent Application previously filed by the same applicant, that is, JP-A-2011-235764 (filed on Oct. 27, 2011), and the content thereof is incorporated herein by reference.

REFERENCE SIGNS LIST

1 BASE MATERIAL MOUNTING TABLE
2 BASE MATERIAL
T INDUCTION COUPLING-TYPE PLASMA TORCH UNIT
3, 19 SPIRAL COIL
4 FIRST QUARTZ PLATE
5 SECOND QUARTZ PLATE
6 THIRD QUARTZ PLATE
7 INSIDE (SPACE IN CHAMBER)
8 PLASMA EJECTION PORT (OPENING PORTION)
9 PLASMA GAS MANIFOLD
10 PLASMA GAS SUPPLY PIPE
11 PLASMA GAS SUPPLY HOLE
12 ADHESIVE
13 SHIELDING GAS NOZZLE
14 SHIELDING GAS MANIFOLD
15 WATER COOLING TUBE
22 THIN FILM
25 CHAMBER

The invention claimed is:

1. A plasma processing apparatus comprising:
a chamber having an opening portion;
a gas supply apparatus that supplies gas into the chamber;
two spiral coils;
a high-frequency electric power supply connected to the spiral coils;
a base material mounting table which is disposed opposite to the opening portion and holds a base material; and
a moving mechanism which enables the chamber and the base material mounting table to relatively move,
wherein the chamber is sandwiched between the two spiral coils.

2. The plasma processing apparatus according to claim 1, wherein at least one of the spiral coils is planer.

3. The plasma processing apparatus according to claim 2, wherein an inner wall surface of the chamber on a side near the at least one of the two spiral coils is a plane in parallel with a plane that the at least one of the two spiral coils forms.

4. The plasma processing apparatus according to claim 1, wherein the chamber is configured as a space sandwiched by two dielectric plates having a groove on at least one side.

5. The plasma processing apparatus according to claim 1, wherein a depth of the chamber is 1 mm to 5 mm.

6. The plasma processing apparatus according to claim 1, wherein the at least one of the two spiral coils is constituted by a hollow tube, is configured to allow a cooling medium to flow therein, and is adhered to a member that composes a wall surface of the chamber or a member adhered to the member that composes the wall surface of the chamber.

* * * * *